(12) United States Patent
Chen

(10) Patent No.: US 10,447,284 B1
(45) Date of Patent: Oct. 15, 2019

(54) MECHANISM FOR ADJUSTING CHARACTERISTICS OF INTER-STAGE CIRCUIT TO MITIGATE OR REDUCE DCO PULLING EFFECT

(71) Applicant: PixArt Imaging Inc., Hsin-Chu (TW)

(72) Inventor: Peng-Sen Chen, Hsin-Chu (TW)

(73) Assignee: Audiowise Technology Inc., Hsinchu County (TW)

( * ) Notice: Subject to any disclaimer, the term of this patent is extended or adjusted under 35 U.S.C. 154(b) by 0 days.

(21) Appl. No.: 16/101,517

(22) Filed: Aug. 12, 2018

(51) Int. Cl.
*H03L 7/099* (2006.01)
*H03L 7/081* (2006.01)
*H03L 7/093* (2006.01)

(52) U.S. Cl.
CPC ............ *H03L 7/0992* (2013.01); *H03L 7/081* (2013.01); *H03L 7/093* (2013.01)

(58) Field of Classification Search
CPC . H03L 7/0992; H03L 7/081; H03F 2200/336; H03F 3/24; H03F 1/3241; H03F 2200/324; H03C 3/40; H03C 5/00; H04B 17/13; H04L 27/365
See application file for complete search history.

(56) References Cited

U.S. PATENT DOCUMENTS

| | | | | |
|---|---|---|---|---|
| 8,779,867 | B2* | 7/2014 | Thaller | H03B 5/1228 331/117 FE |
| 8,803,627 | B1* | 8/2014 | Xu | H03B 5/1228 331/16 |
| 2006/0291589 | A1* | 12/2006 | Eliezer | H03C 3/40 375/302 |
| 2007/0008199 | A1* | 1/2007 | Rezeq | H03F 1/0205 341/118 |
| 2007/0190952 | A1* | 8/2007 | Waheed | H04B 1/0475 455/114.3 |
| 2012/0244824 | A1* | 9/2012 | Entezari | H03L 7/1806 455/114.2 |
| 2013/0265114 | A1* | 10/2013 | Lee | H03L 7/095 331/1 A |

* cited by examiner

*Primary Examiner* — Khanh C Tran
(74) *Attorney, Agent, or Firm* — Winston Hsu

(57) ABSTRACT

A method of a control circuit of a communication device comprises: receiving a data signal to generate a phase data signal to a digital phase-locked loop (DPLL); using the DPLL to receive the phase data signal, to dynamically lock a particular clock, and to generate a phase modulation signal based on the phase data signal; and determining or adjusting an equivalent capacitance of an inter-stage circuit which is coupled between the DPLL and a power amplifier and configured for processing the phase modulation signal and generating a processed phase modulation signal to the power amplifier.

20 Claims, 4 Drawing Sheets

MECHANISM FOR ADJUSTING CHARACTERISTICS OF INTER-STAGE CIRCUIT TO MITIGATE OR REDUCE DCO PULLING EFFECT

BACKGROUND OF THE INVENTION

1. Field of the Invention

The invention relates to a communication mechanism, and more particularly to a control circuit of a communication device, a processing circuit, and a corresponding method.

2. Description of the Prior Art

Generally speaking, for a communication device such as a polar transmitter, the amplitude modulation path and phase modulation path may be combined at a power amplifier stage. Ideally, a digital phase-lock loop (DPLL) including a digitally controlled oscillator (DCO) is able to lock a particular frequency. Unfortunately, the performance of DCO is easily affected by the power amplifier stage. The DCO pulling effect is introduced due to that the inductive or electromagnetic crosstalk may be injected to the DCO, and this may cause the frequency generated by the DCO has a drift and/or the phase is shifted.

A conventional scheme employs a more complex to mitigate the DCO pulling effect. However, the size of need circuit components is very large, and also consume more power. In addition, the conventional scheme cannot real-timely mitigate the DCO pulling effect.

SUMMARY OF THE INVENTION

One of the objectives of the invention is to provide a control circuit of a communication, a processing circuit, and a corresponding method for mitigating the DCO pulling effect, to solve the above-mentioned problems.

According to embodiments of the invention, a control circuit of a communication device is disclosed. The output of the control circuit is coupled to a power amplifier. The control circuit comprises a processing circuit, a digital phase-locked loop (DPLL), and an inter-stage circuit. The processing circuit is configured for receiving a data signal to generate a phase data signal to the DPLL. The DPLL is coupled to the processing circuit and configured for receiving the phase data signal, dynamically locking a particular clock, and generating a phase modulation signal based on the phase data signal. The inter-stage circuit is coupled between the DPLL and the power amplifier, and is configured for processing the phase modulation signal and generating a processed phase modulation signal to the power amplifier. The processing circuit is arranged to determine or adjust characteristics of the inter-stage circuit, e.g. the equivalent capacitance (but not limited).

According to the embodiments, a method of a control circuit of a communication device is disclosed. The output of the control circuit is coupled to a power amplifier. The method comprises: receiving a data signal to generate a phase data signal to a digital phase-locked loop (DPLL); using the DPLL to receive the phase data signal, to dynamically lock a particular clock, and to generate a phase modulation signal based on the phase data signal; and determining or adjusting an equivalent capacitance of an inter-stage circuit which is coupled between the DPLL and the power amplifier and configured for processing the phase modulation signal and generating an processed phase modulation signal to the power amplifier.

According to the embodiments, a processing circuit of a communication device is disclosed. The communication device further includes a digital phase-locked loop (DPLL), a power amplifier, and an inter-stage circuit coupled between the DPLL and the power amplifier. The processing circuit comprises a register circuit and a calibration module. The register circuit is configured to store information obtained from the DPLL. The calibration module is coupled to the register circuit, and is configured to determine or adjust an equivalent capacitance of the inter-stage circuit based on the information of the DPLL stored in the register circuit.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a solution/process capable of mitigating or calibrating/compensating DCO (digitally controlled oscillator) pulling effects in a communication device such as a polar transmitter/transceiver (but not limited) as well as saving circuit costs and more power. In addition, compared to the conventional scheme, the provided solution needs less complex calculation.

Figure 1:
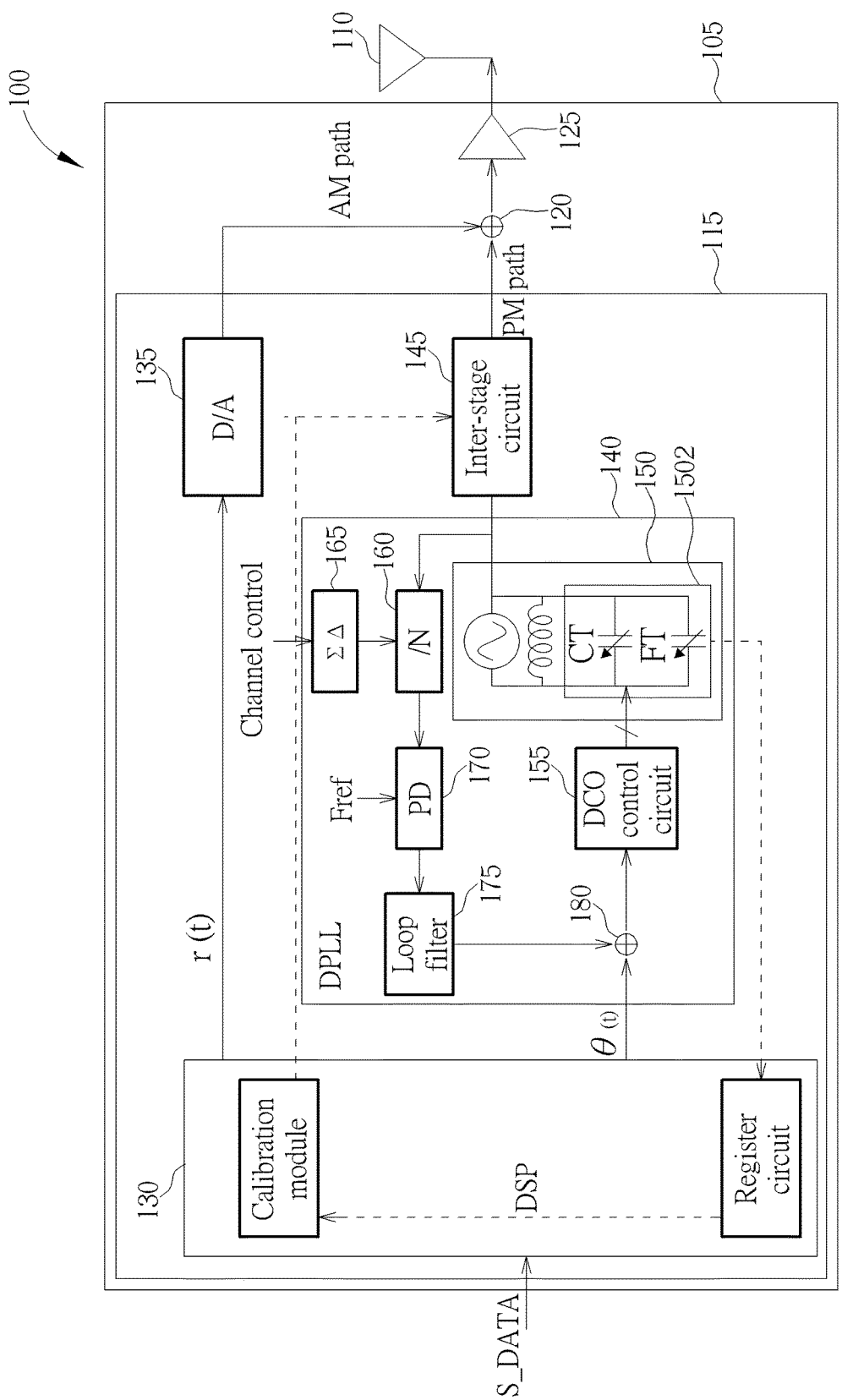
FIG. 1 is a diagram of a communication device according to embodiments of the invention.

FIG. 1 is a diagram of a communication device 100 according to embodiments of the invention. The communication device 100 for example supports a polar transmission approach and comprises a transmitter circuit 105 such as a polar transmitter (but not limited) and an antenna 110. The transmitter circuit 105 comprises a control circuit 115, an analog adder 120, and a power amplifier 125. The control circuit 115 may be regarded as a digital control circuit or an analog/digital hybrid control circuit and comprises a digital signal processing circuit (DSP) 130, an digital-to-analog converter (DAC) 135, a digital phase-locked loop (DPLL) 140, and an inter-stage (intermediate) circuit 145 which is coupled/placed between the DPLL 140 and the analog adder 120 (or the power amplifier 125). In the normal transmission mode of the polar transmission approach, the transmissions of amplitude modulation (AM) and phase modulation (PM) are separated during different time intervals which may be separated by a guard interval. The communication device 100 employs different paths for the AM and PM transmissions. In addition, the communication device 100 as a polar transmitter is suitable for a non-constant envelope modulation scheme such as Bluetooth enhanced data rate (EDR), GSM-EDGE, or Wi-Fi modulation scheme.

In practice, the DSP 130 is arranged to receive a data signal S_DATA such as a data symbol signal comprising I/Q (in-phase and quadrature-phase) symbols to convert the data signal S_DATA into an amplitude modulation (AM) signal r(t) and a phase modulation (PM) data signal θ (t). The AM signal r(t) is a digital signal which is received by the DAC 135 which is arranged to convert the AM signal r (t) into an AM analog signal. For example, the DSP 130 may be modulate amplitude data (obtained from the data signal S_DATA) by using GFSK modulation (but not limited) to generate the AM data signal r(t). Then, the AM analog signal is received by the analog adder 120, and the analog adder 120 is arranged to output the AM analog signal into the power amplifier 125 which may be arranged to amplify the AM analog signal with a gain value to generate an amplified signal. Then, the amplified signal is transmitted via the antenna 110 into the air.

In addition, the DSP 130 is arranged to output the phase data signal θ (t) into the DPLL 140. The DPLL 140 is arranged to dynamically lock a particular frequency and modulate the phase data signal θ (t) to generate a phase modulation signal such as a DPSK modulation signal with the particular frequency based on the phase data signal θ (t), a reference frequency Fref, and a channel control signal such as a channel word. For example, the particular frequency may be configured as the reference frequency multiplied by the value indicated by the channel word (but not limited).

In practice, the DPLL 140 comprises a digitally controlled oscillator (DCO) 150, a DCO control circuit 155, a frequency divider 160 with a dividing factor N, a sigma-delta modulator (SDM) 165, a phase detector (PD) 170, a loop filter 175, and a digital adder 180.

The phase data signal θ (t) and a feedback signal from the loop filter 175 are received by the digital adder 180 to generate a phase signal. The DCO control circuit 155 is arranged to receive such phase signal and generate a control signal to the DCO 150 based on the phase signal.

The DCO 150 for example comprises a DCO oscillation circuit 1501, an inductor L, and a tunable capacitor array 1502. The capacitor array 1502 for example comprises two sets of tunable capacitors such as a set of coarse tuning capacitors and a set of fine tuning capacitors. For instance, the control signal outputted from the DCO control signal is arranged to use a coarse tuning signal such as fourteen bits of a coarse tuning code to control/determine/adjust the equivalent capacitance formed by the set of coarse tuning capacitors and use a fine tuning signal such as fourteen bits of a fine tuning code to control/determine/adjust the equivalent capacitance formed by the set of fine tuning capacitors. The DCO oscillation circuit 1501 is arranged to generate and output the oscillation frequency, e.g. the particular frequency with the phase data signal θ (t) based on the equivalent impedance formed by the inductor L and the two sets of tunable capacitors.

Also, the DPLL 140 is a closed loop, and the oscillation frequency generated from the DCO 150 is feed back to the frequency divider 160 which is arranged to use the dividing factor N to perform frequency division upon a received signal wherein the factor N may be an integer (but not limited). The frequency divider 160 is also controlled by an output signal of the SDM 165 which is arranged to receive the channel control signal. The phase detector 170 is arranged to receive the reference frequency signal Fref and the divided signal from the frequency divider 160 to generate a phase error/difference signal to the loop filter 175.

The loop filter 175 is arranged to receive the phase error/difference signal to generate the feedback signal which may be regarded as a feedback phase signal.

The inter-stage circuit 145 is arranged to receive and process the oscillation frequency signal to generate the resultant phase modulation signal to the analog adder 120.

Ideally, the DPLL 140 can dynamically lock a particular frequency. Actually, the DPLL 140 may be affected by the impedance or equivalent capacitance of the inter-stage circuit 145. The DCO pulling effect is usually introduced.

In the embodiments, the DSP 130 comprises a register circuit and a calibration module (formed by the hardware, software, or in combination). The calibration module is arranged to adjust the characteristics (e.g. the equivalent capacitance (but not limited)) of at least one portion/part of circuit components included by the inter-stage circuit 145 to make the isolation between the control circuit 115 and the analog adder 120 be smaller or smallest, so as to mitigate or reduce the DCO pulling effect.

In practice, the calibration module may be arranged to determine or adjust a power supply voltage or a power sully current provided for the at least one portion/part of circuit components included by the inter-stage circuit 145, to adjust the equivalent capacitance. It should be noted that the power supply voltage/current adjusted by the calibration module can be regarded as an adjustable/tunable parameter for the at least one portion/part of circuit components. The calibration module in other embodiments may control or adjust different kinds of parameter of the inter-stage circuit 145, to adjust the equivalent capacitance of the at least one portion/part of circuit components. This also falls within the scope of the invention. Adjusting a power supply voltage/current is not intended to be a limitation of the invention.

The operation of adjusting the equivalent capacitance is performed based on the information obtained or retrieved from the capacitor array 1502 within the DCO 150. Such information for example is the fourteen bits of fine tuning code and/or the fourteen bits of coarse tuning code. In a preferred embodiment, the operation of adjusting the equivalent capacitance is performed based on merely the bits of fine tuning code (but not limited). The register circuit is arranged to sore such information, and the calibration module is arranged to adjust the above-mentioned capacitance based on the information stored in the register circuit.

Figure 2:
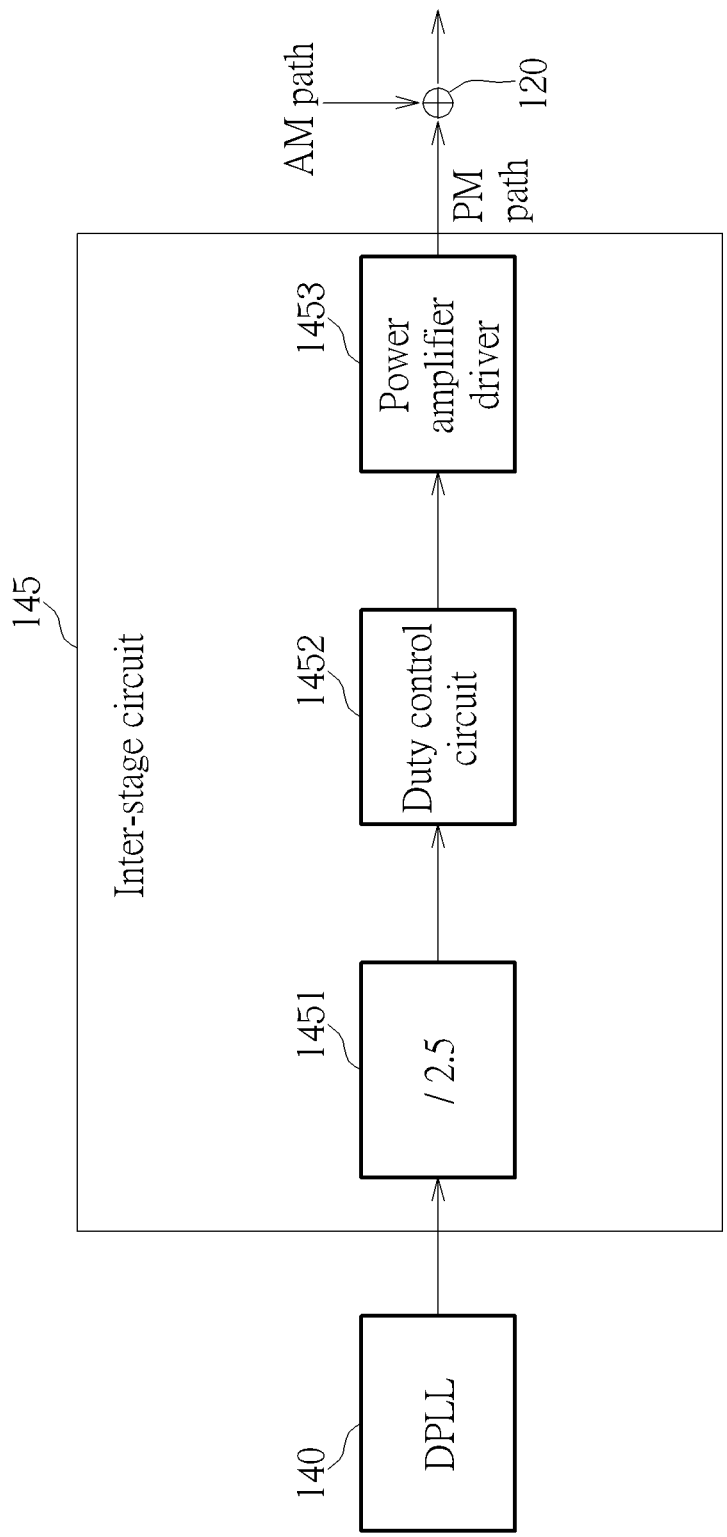
FIG. 2 is a diagram illustrating an example of the circuit components included within the inter-stage circuit according to the embodiments of FIG. 1.

FIG. 2 is a diagram illustrating an example of the circuit components included within the inter-stage circuit 145 according to the embodiments of FIG. 1. As shown by FIG. 2, the inter-stage circuit 145 comprises a frequency divider such as a fractional divider 1451 with a fractional dividing factor 2.5 (but not limited), a duty control circuit 1452, and a power amplifier driver 1453. This is not meant to be a limitation. In other embodiments, the duty control circuit 1452 may be optional. It is noted that the number of circuit component (s) included within the inter-stage circuit 145 is not meant to be a limitation. The inter-stage circuit 145 may comprise circuit components different from the above-mentioned circuits.

The fractional frequency divider 1451 is arranged to perform a frequency dividing operation up on the oscillation frequency signal outputted from the DPLL 140 to generate a divided frequency signal. The duty control circuit 1452 is coupled to the fractional frequency divider 1451 and is arranged to adjust the duty of the divided frequency signal to generate an adjusted signal. For example, the divided frequency signal may have 60% duty, and the duty control circuit 1452 may be arranged to adjust the 60% duty as 50% duty to generate the adjusted signal. The adjusted signal is received by the power amplifier driver 1453 which is arranged to generate the phase modulation signal to the analog adder 120.

The calibration module based on the information latched in the register circuit is capable of adjusting the power supply voltage or power supply current provided for at least one among the three circuit components included within the inter-stage circuit 145, to adjust the equivalent capacitance. Alternatively, the calibration module is able to adjust the power supply voltage or power supply current respectively provided for each of the three circuit components individually and independently.

In practice, for a circuit component included within the inter-stage circuit 145, e.g. the fractional divider 1451, the calibration module in an embodiment may be arranged to preliminarily adjust and configure the power supply voltage/current provided for the fractional divider 1451 as a first voltage/current level, to correspondingly and preliminarily adjust the equivalent capacitance of the fractional divider 1451 as a first capacitance seen by the DPLL 140. When the power amplifier 125 is turned off (which may be controlled by the calibration module or other circuits), the DPLL 140 operates to lock a particular frequency based on a closed loop system. When the DPLL 140 locks the particular frequency, the calibration module is arranged to obtain and retrieve/latch the information of the capacitor array 1502 such as the fourteen bits of fine tuning code, represented by FT<13:0> on FIG. 1. The fourteen bits of fine tuning code which indicates a first FT value are stored in the register circuit. Then, the power amplifier 125 is turned on (which may be controlled by the calibration module or other circuits). In this situation, the DPLL 140 also operates to lock the particular frequency based on the closed loop system. When the DPLL 140 locks the particular frequency, the calibration module is arranged to obtain and retrieve/latch the information of the capacitor array 1502 such as the fourteen bits of fine tuning code, represented by FT<13:0> on FIG. 1. The fourteen bits of fine tuning code which indicates a second FT value are stored in the register circuit.

Based on the first FT value and second FT value, the calibration module can calculate and obtain a FT difference/error for the first voltage/current level set for the fractional divider 1451.

Then, by similarly performing the above steps, the calibration module may preliminarily adjust and configure the power supply voltage/current provided for the fractional divider 1451 as a second voltage/current level, to correspondingly and preliminarily adjust the equivalent capacitance of the fractional divider 1451 as a second capacitance seen by the DPLL 140. When the power amplifier 125 is turned off, the DPLL 140 operates to lock the particular frequency. When the DPLL 140 locks the particular frequency, the calibration module is arranged to obtain and retrieve/latch the information of the capacitor array 1502 such as the fourteen bits of fine tuning code. The fourteen bits of fine tuning code which indicates another first FT value are stored in the register circuit. Then, the power amplifier 125 is turned on, and the DPLL 140 also operates to lock the particular frequency. When the DPLL 140 locks the particular frequency, the calibration module is arranged to obtain and retrieve/latch the fourteen bits of fine tuning code. The fourteen bits of fine tuning code which indicates another second FT value are stored in the register circuit.

Based on the another set of first FT value and second FT value, the calibration module can calculate and obtain another FT difference/error for the second voltage/current level set for the fractional divider 1451.

In one embodiment, the calibration module may compare the first FT value with the second FT value to determine which value is smaller. If the second FT value is smaller, then the calibration module is arranged to configure the second power supply voltage/current level as a resultant power supply voltage/current provided for the fractional divider 1451, to control the equivalent capacitance of fractional divider 1451 to mitigate the DCO pulling effect. Otherwise, if the first FT value is smaller, then the calibration module will configure the first power supply voltage/current level as the resultant power supply voltage/current.

For example, the calibration module may configure the first and second supply voltage/current levels as extreme levels such as minimum voltage/current level and maximum voltage/current level. That is, the calibration module may be arranged to determine one among the maximum capacitance and minimum capacitance of the fractional divider 1451 as the resultant capacitance of fractional divider 1451 correspondingly, to mitigate the DCO pulling effect.

In addition, the above-mentioned procedure for the fractional divider 1451 is also suitable for other circuit components included within the inter-stage circuit 145, e.g. the duty control circuit 1452 and the power amplifier driver 1453, to mitigate the DCO pulling effect caused by the other circuit components. To simplify the specification of the instant application, the corresponding description is not detailed for brevity.

Further, in other embodiments, for a circuit component included within the inter-stage circuit 145, e.g. the fractional divider 1451, the calibration module may adjust and configure the power supply voltage/current provided for the fractional divider 1451 from an extreme level (e.g. a minimum level (but not limited)) of a supply voltage/current range to another extreme level such as a maximum level (but not limited) step by step each time, to correspondingly and gradually adjust the equivalent capacitance of the fractional divider 1451. In this example, the power amplifier 125 is turned on and then turned off respectively each time when the power supply voltage/current provided for the fractional divider 1451 is finely tuned as a newly voltage/current level. Similarly, when the power amplifier 125 is turned on and off for each configured/adjusted voltage/current level, the calibration module can obtain and retrieve/latch two FT values in the register circuit after the DPLL 140 locks the particular frequency and thus can calculate/derive a FT difference/error. Accordingly, the calibration module can obtain multiple FT differences/errors after gradually adjusting the power supply voltage/current level step by step. The calibration module is arranged to select a minimum FT difference/error among the multiple FT differences/errors, and then is arranged to configure the resultant power supply voltage/current level provided for the fractional divider 1451 as a voltage/current level corresponding to the minimum FT difference/error, to mitigate or reduce the DCO pulling effect caused by the fractional divider 1451.

Similarly, the above-mentioned gradually adjusting procedure for the fractional divider 1451 is also suitable for other circuit components included within the inter-stage circuit 145, e.g. the duty control circuit 1452 and the power amplifier driver 1453, to reduce the DCO pulling effect caused by the other circuit components. To simplify the specification of the instant application, the corresponding description is not detailed for brevity.

Figure 3:
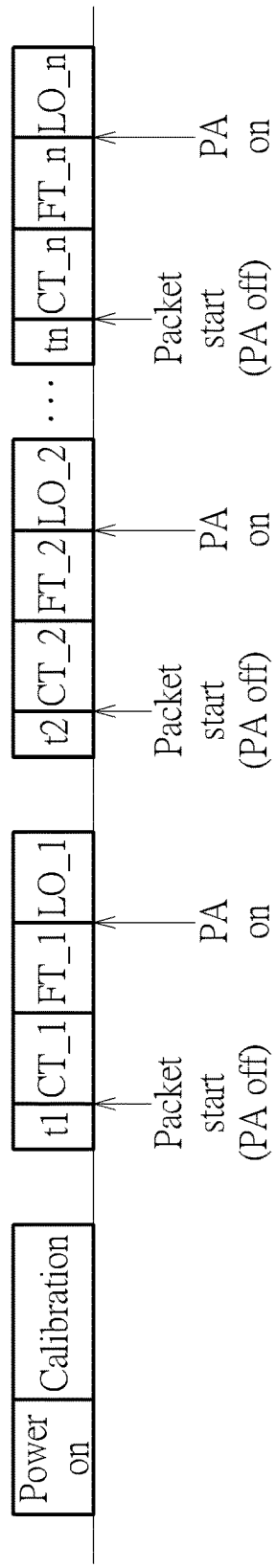
FIG. 3 is a diagram illustrating an example of gradually adjusting the capacitance of a circuit component within inter-stage circuit to mitigate DCO pulling effect in a communication system such as a Bluetooth communication system according to the embodiment of FIG. 1.

FIG. 3 is a diagram illustrating an example of gradually adjusting the capacitance of a circuit component within inter-stage circuit 145 to mitigate DCO pulling effect in a communication system such as a Bluetooth communication system according to the embodiment of FIG. 1. As shown on FIG. 3, for example, it is arranged to gradually adjust the capacitance of a circuit component such as the above-mentioned fractional divider 1451; however, this is not meant to be a limitation. This is also suitable for the other circuit components within inter-stage circuit 145.

When the control circuit 115 is powered on, the control circuit 115 is arranged to enter a calibration mode for mitigating DCO pulling effect. In the calibration mode, the power amplifier 125 is turned on and off (which may be controlled by the control circuit 115 or other circuits) and correspondingly the DPLL 140 operates to lock the frequency based on a Bluetooth packet format. For example, during interval t1, the control circuit 115 adjusts or configures the capacitance of fractional divider 1451 as a first capacitance, and the power amplifier 125 is off or is turned off at the packet start of a Bluetooth packet format. During intervals CT_1 and FT_1, the DPLL 140 operates to lock the particular frequency, and the calibration module is arranged to retrieve the information of capacitor array 1502, e.g. the information of fine tuning code, at the end of FT_1. After the information of fine tuning code has been latched in the register circuit, the power amplifier 125 is turned on, and the DPLL 140 is arranged to operate to lock the frequency during the interval LO_1; for example, the communication device 100 may generate a local single tone signal during the interval LO_1. At the end of interval LO_1, the calibration module is arranged obtain the information of fine tuning code again, and the information of fine tuning code is latched in the register circuit.

Similarly, during interval t2, the control circuit 115 adjusts or configures the capacitance of fractional divider 1451 as a second capacitance, and the power amplifier 125 is off or is turned off at the packet start of a Bluetooth packet format. During intervals CT_2 and FT_2, the DPLL 140 operates to lock the particular frequency, and the calibration module is arranged to retrieve the information of capacitor array 1502, e.g. the information of fine tuning code, at the end of FT_2. After the information of fine tuning code has been latched in the register circuit, the power amplifier 125 is turned on, and the DPLL 140 is arranged to operate to lock the frequency during the interval LO_2; for example, the communication device 100 may generate a local single tone signal during the interval LO_2. At the end of interval LO_2, the calibration module is arranged to obtain the information of fine tuning code again, and the information of fine tuning code is latched in the register circuit.

Similarly, during interval tn, the control circuit 115 adjusts or configures the capacitance of fractional divider 1451 as the n-th capacitance, and the power amplifier 125 is off or is turned off at the packet start of a Bluetooth packet format. During intervals CT n and FT_n, the DPLL 140 operates to lock the particular frequency, and the calibration module is arranged to retrieve the information of capacitor array 1502, e.g. the information of fine tuning code, at the end of FT_n. After the information of fine tuning code has been latched in the register circuit, the power amplifier 125 is turned on, and the DPLL 140 is arranged to operate to lock the frequency during the interval LO_n; for example, the communication device 100 may generate a local single tone signal during the interval LO_n. At the end of interval LO_n, the calibration module is arranged to obtain the information of fine tuning code again, and the information of fine tuning code is latched in the register circuit.

Further, in one embodiment, the calibration module may employ a binary search or successive approximation process to find a minimum FT difference/error without calculating all FT differences/errors. For example, the adjustable voltage/current levels for the fractional divider 1451 may comprise eight levels. Based on the binary search or successive approximation process, it is not needed for the calibration module to configure all the adjustable eight levels to calculate all FT differences/errors. The calibration module may find or obtain the minimum FT difference/error by calculating merely two or three FT differences/errors based on the binary search or successive approximation process. This can effectively reduce the waiting time for calibration.

Further, for different corner samples of a circuit component such as one of the fractional divider 1451, duty control circuit 1452, and power amplifier driver 1453, the calibration module may determine/find different resultant parameter values to adjust the circuit component. For example, the following table shows different resultant parameter values corresponding to different corner samples:

| Corner sample | Resultant parameter for fractional divider | Resultant parameter for duty control circuit | Resultant parameter for power amplifier driver |
|---|---|---|---|
| SS04 | 24 | 0 | 15 |
| FF02 | 24 | 15 | 15 |
| TT02 | 18 | 15 | 7 |

It should be noted that the examples shown by the table is merely used for illustrative purposes and are not meant to be a limitation of the invention.

Figure 4:
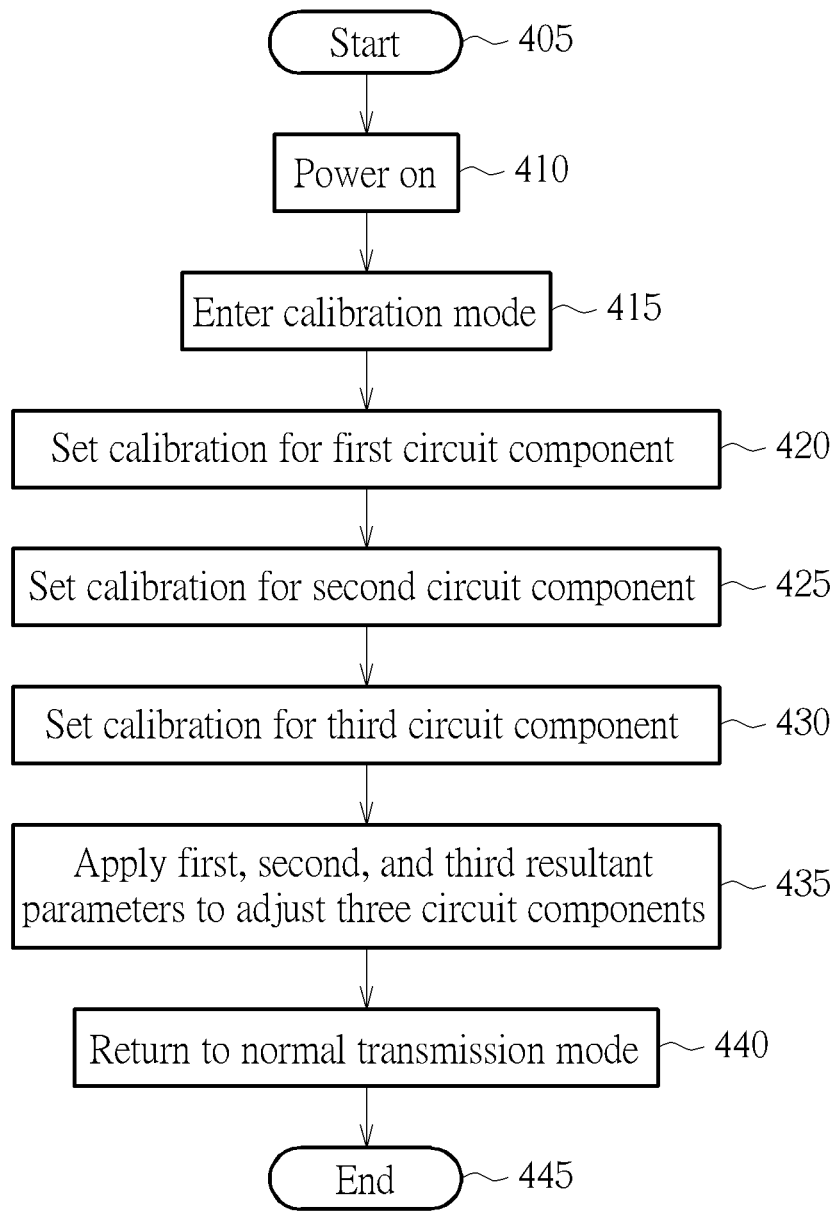
FIG. 4 is a diagram showing a flowchart of calibrating DCO effect caused by the circuit components included within the inter-stage circuit according to the embodiments of FIG. 1 and FIG. 2.

To make readers more clearly understand the calibration process for mitigating the DCO pulling effect, FIG. 4 is provided. FIG. 4 is a diagram showing a flowchart of calibrating DCO effect caused by the circuit components included within the inter-stage circuit 145 according to the embodiments of FIG. 1 and FIG. 2. Provided that substantially the same result is achieved, the steps of the flowchart shown in FIG. 4 need not be in the exact order shown and need not be contiguous, that is, other steps can be intermediate. Steps are detailed in the following:

Step 405: Start;
Step 410: Power on the control circuit 115;
Step 415: Enter the calibration mode;
Step 420: Set the calibration for a first circuit component such as the fractional divider 1451 within the inter-stage circuit 145 by fixing a second parameter for a second circuit component such as duty control circuit 1452, fixing a third parameter for a third circuit component such as power amplifier driver 1453, and by adjusting a first parameter for the first circuit component, to find a minimum fine tuning difference/error so as to find a first resultant parameter;
Step 425: Set the calibration for the second circuit component by fixing the first parameter and the third parameter and by adjusting the second parameter for the second circuit component, to find a minimum fine tuning difference/error so as to find a second resultant parameter;
Step 430: Set the calibration for the third circuit component by fixing the first parameter and the second parameter and by adjusting the third parameter for the third circuit component, to find a minimum fine tuning difference/error so as to find a third resultant parameter;
Step 435: Apply the first, second, and third resultant parameters to adjust the three circuit components; and
Step 440: Return to a normal transmission mode; and
Step 445: End.

According to the embodiments, the communication device 100 is capable of real-timely compensate or mitigate the DCO pulling effects caused by the inter-stage circuit 145. For example, when device 100 is used at different temperatures such as higher and lower temperatures, the characteristics of circuit components may be varied and the DCO pulling effect is introduced. By the above-mentioned calibration process, the communication device 100 is capable of real-timely compensate or mitigate the DCO pulling effects caused by the inter-stage circuit 145.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control circuit of a communication device, an output of the control circuit being coupled to a power amplifier, and the control circuit comprises:
   a processing circuit, configured for receiving a data signal to generate a phase data signal to a digital phase-locked loop (DPLL);
   the DPLL, coupled to the processing circuit, configured for receiving the phase data signal, dynamically locking a particular clock, and generating a phase modulation signal based on the phase data signal;
   an inter-stage circuit, coupled between the DPLL and the power amplifier, configured for processing the phase modulation signal and generating an processed phase modulation signal to the power amplifier;
   wherein the processing circuit is arranged to determine or adjust an equivalent capacitance of the inter-stage circuit.

2. The control circuit of claim 1, wherein the DPLL comprises a digitally controlled oscillator and a tunable capacitor array, and the processing circuit is arranged to obtain at least one tuning value of the tunable capacitor array of the DPLL to determine the equivalent capacitance of the inter-stage circuit.

3. The control circuit of claim 2, wherein the processing circuit comprises:
   a register circuit, configured for latching the at least one tuning value; and
   a calibration module, coupled to the register circuit, configured for adjusting the equivalent capacitance of the inter-stage circuit by determining a power supply signal provided for the inter-stage circuit based on the latched at least one tuning value.

4. The control circuit of claim 3, wherein the power supply signal is a supply voltage or a supply current provided for the inter-stage circuit.

5. The control circuit of claim 2, wherein the inter-stage circuit comprises a plurality of circuit components, and the calibration circuit is arranged to respectively and individually adjusting a plurality of equivalent capacitances of the plurality of circuit components according to the at least one tuning value.

6. The control circuit of claim 2, wherein the calibration module is arranged to preliminarily configure the equivalent capacitance of the inter-stage circuit as a first value, calculate a first difference between tuning values of the tunable capacitor array based on the configured first value when the power amplifier is turned off and turned on, preliminarily configure the equivalent capacitance of the inter-stage circuit as a second value, calculate a second difference between tuning values of the tunable capacitor array based on the configured second value when the power amplifier is turned off and turned on, and determine the equivalent capacitance of the inter-stage circuit based on the first difference and the second difference.

7. The control circuit of claim 6, wherein the calibration module is arranged to set a power supply signal provided for the inter-stage circuit to configure the equivalent capacitance as a particular value.

8. The control circuit of claim 6, when the first difference is smaller than the second difference, the calibration module is arranged to determine the equivalent capacitance of the inter-stage circuit as the first value.

9. The control circuit of claim 1, wherein the inter-stage circuit comprises at least one of a fractional divider, a duty control circuit, and a power amplifier driver.

10. A method of a control circuit of a communication device, an output of the control circuit being coupled to a power amplifier, and the method comprises:
    receiving a data signal to generate a phase data signal to a digital phase-locked loop (DPLL);
    using the DPLL to receive the phase data signal, to dynamically lock a particular clock, and to generate a phase modulation signal based on the phase data signal; and
    determining or adjusting an equivalent capacitance of an inter-stage circuit which is coupled between the DPLL and the power amplifier and configured for processing the phase modulation signal and generating a processed phase modulation signal to the power amplifier.

11. The method of claim 10, wherein the DPLL comprises a digitally controlled oscillator and a tunable capacitor array, and the step of determining or adjusting the equivalent capacitance comprises:
    obtaining at least one tuning value of the tunable capacitor array of the DPLL to determine the equivalent capacitance of the inter-stage circuit.

12. The method of claim 11, wherein the step of determining or adjusting the equivalent capacitance comprises:
    latching the at least one tuning value; and
    adjusting the equivalent capacitance of the inter-stage circuit by determining a power supply signal provided for the inter-stage circuit based on the latched at least one tuning value.

13. The method of claim 12, wherein the power supply signal is a supply voltage or a supply current provided for the inter-stage circuit.

14. The method of claim 11, wherein the inter-stage circuit comprises a plurality of circuit components, and the step of determining or adjusting the equivalent capacitance comprises:
    respectively and individually adjusting a plurality of equivalent capacitances of the plurality of circuit components according to the at least one tuning value.

15. The method of claim 11, wherein the step of determining or adjusting the equivalent capacitance comprises:
    preliminarily configuring the equivalent capacitance of the inter-stage circuit as a first value;
    calculating a first difference between tuning values of the tunable capacitor array based on the configured first value when the power amplifier is turned off and turned on;
    preliminarily configuring the equivalent capacitance of the inter-stage circuit as a second value;
    calculating a second difference between tuning values of the tunable capacitor array based on the configured second value when the power amplifier is turned off and turned on; and determining the equivalent capacitance of the inter-stage circuit based on the first difference and the second difference.

16. The method of claim 15, further comprising:
setting a power supply signal provided for the inter-stage circuit to configure the equivalent capacitance as a particular value.

17. The method of claim 15, wherein the step of determining the equivalent capacitance comprises:
determining the equivalent capacitance of the inter-stage circuit as the first value when the first difference is smaller than the second difference.

18. The method of claim 10, wherein the inter-stage circuit comprises at least one of a fractional divider, a duty control circuit, and a power amplifier driver.

19. A processing circuit of a communication device, the communication device further including a digital phase-locked loop (DPLL), a power amplifier, and an inter-stage circuit coupled between the DPLL and the power amplifier, and the processing circuit comprises:
a register circuit, configured to store information obtained from the DPLL; and
a calibration module, coupled to the register circuit, configured to determine or adjust an equivalent capacitance of the inter-stage circuit based on the information of the DPLL stored in the register circuit.

20. The processing circuit of claim 19, wherein the DPLL comprises a digitally controlled oscillator and a tunable capacitor array, and the processing circuit is arranged to obtain at least one tuning value of the tunable capacitor array of the DPLL, store the obtained at least one tuning value in the register circuit, and to determine the equivalent capacitance of the inter-stage circuit according to the stored at least one tuning value in the register circuit.

* * * * *